(12) United States Patent
Cheney et al.

(10) Patent No.: US 9,691,675 B1
(45) Date of Patent: Jun. 27, 2017

(54) METHOD FOR FORMING AN ELECTRICAL DEVICE AND ELECTRICAL DEVICES

(71) Applicant: Intel Corporation, Santa Clara, CA (US)

(72) Inventors: Robert F Cheney, Chandler, AZ (US); Ashish Dhall, Chandler, AZ (US); Suriyakala Ramalingam, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/977,670

(22) Filed: Dec. 22, 2015

(51) Int. Cl.
| | | |
|---|---|---|
| *H01L 23/04* | (2006.01) | |
| *H01L 23/24* | (2006.01) | |
| *H01L 21/48* | (2006.01) | |
| *H01L 21/56* | (2006.01) | |
| *H01L 23/498* | (2006.01) | |
| *H01L 23/31* | (2006.01) | |

(52) U.S. Cl.
CPC .......... *H01L 23/24* (2013.01); *H01L 21/4853* (2013.01); *H01L 21/563* (2013.01); *H01L 23/3114* (2013.01); *H01L 23/49838* (2013.01)

(58) Field of Classification Search
CPC .......... H01L 21/28079; H01L 23/3114; H01L 23/4951; H01L 27/0814; H01L 29/6603; H01L 29/1606; H01L 29/0649; H01L 51/4226; H01L 51/0034; H01L 51/00432; H01L 23/24; H01L 23/49838

USPC ......... 438/91, 106, 108, 197, 127, 128, 141, 438/455, 456, 780; 257/E21.006, 257/E21.007, E21.053, E21.126, E21.127, 257/E21.264, E21.267, E21.352, E21.366, 257/E21.499, E21.501, E21.503, 730

See application file for complete search history.

(56) References Cited

U.S. PATENT DOCUMENTS

| | | | | |
|---|---|---|---|---|
| 7,317,257 | B2 * | 1/2008 | See .................. | B82Y 10/00 257/778 |
| 7,550,097 | B2 * | 6/2009 | Tonapi .............. | C09K 5/14 252/512 |
| 2002/0135063 | A1 * | 9/2002 | Alcoe ................ | H01L 21/563 257/734 |
| 2005/0121806 | A1 * | 6/2005 | Sangiorgi ........... | H05K 3/305 257/787 |
| 2012/0159118 | A1 * | 6/2012 | Wong ................. | H01L 25/105 712/1 |
| 2016/0181218 | A1 * | 6/2016 | Karhade ............. | H01L 24/97 257/737 |

* cited by examiner

*Primary Examiner* — Anthony Ho
(74) *Attorney, Agent, or Firm* — Blakely, Sokoloff, Taylor & Zafman LLP

(57) ABSTRACT

A method for forming an electrical device includes attaching a semiconductor die on a carrier. The method further includes dispensing a fillet material at at least one edge of the semiconductor die arranged on the carrier. The method further includes dispensing an underfill material into a gap between the semiconductor die and the carrier after dispensing the fillet material.

15 Claims, 9 Drawing Sheets

1

METHOD FOR FORMING AN ELECTRICAL DEVICE AND ELECTRICAL DEVICES

TECHNICAL FIELD

The present disclosure relates to semiconductor package technologies and in particular to a method for forming an electrical device and electrical devices.

BACKGROUND

Electrical devices may suffer from unwanted spreading of underfill materials and large keep-out zones. Large keep-out-zones, in addition to increasing package sizes, may pose additional constraints on multi-chip packages. For example, potential die arrangements may cause interference in the underfilling of one or multiple dies. Complex processes may restrict package design or may add cost and complexity to the process. Furthermore, multiple dispensing processes may impact throughput.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
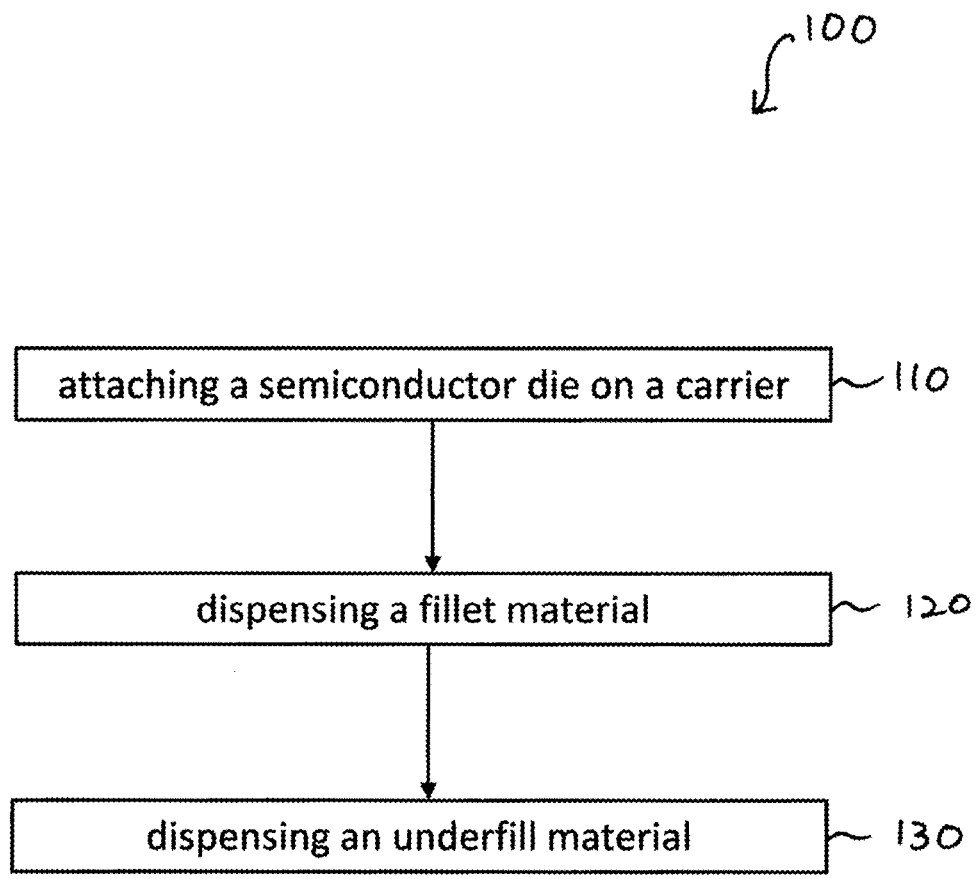
FIG. 1 shows a flow chart of a method for forming an electrical device.

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, examples thereof are shown by way of example in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting of example. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Electrical components or devices are embedded in packages to provide protection against impact and corrosion, to hold the contact pins or leads and/or to dissipate heat produced by the device, for example. For example, a semiconductor package may contain one or more semiconductor components. Individual components may be formed in a silicon wafer before being cut and assembled in a package. A semiconductor package may have only few leads or contacts for devices such as diodes, or may have hundreds of connections in case of a microprocessor, for example. In addition to providing connections to the semiconductor and handling waste heat, the semiconductor package can protect the semiconductor die against the ingress of moisture, for example. Similarly, non-semiconductor electrical components (e.g. resistors, capacitors, inductors) may be arranged in packages.

FIG. 1 shows a schematic illustration of a method 100 for forming an electrical device.

The method 100 comprises attaching 110 a semiconductor die on a carrier. The method further comprises dispensing 120 a fillet material at at least one edge of the semiconductor die arranged on the carrier. The method further comprises dispensing 130 an underfill material into a gap between the semiconductor die and the carrier after dispensing the fillet material.

Due to the dispensing 120 of the underfill material into the gap between the semiconductor die and the carrier after dispensing the fillet material, unwanted spreading of the underfill material may be reduced or eliminated. Thus, underfill material volumes may be reduced and sizes of keep out zones of the electrical device may be reduced, for example. Thus, sizes of electrical devices may be reduced, for example.

The method 100 comprises (or includes) attaching 110 the semiconductor die on the carrier before dispensing 120 the fillet material. The semiconductor die may be attached to the carrier by a flip-chip connection. For example, the attaching of the semiconductor die on (or onto) the carrier may include soldering the semiconductor die to the carrier so that at least one solder structure is located in the gap between the semiconductor die and the carrier. For example, at least one solder structure (which may refer to one or more solder structures, or e.g. a plurality of solder structures) may be arranged on a first lateral side surface (e.g. a front side) of the semiconductor die. The at least one solder structure may be a solder bump or a solder ball, for example. Each solder structure may be formed on (e.g. located on, or e.g. arranged on) a chip contact pad (or bump pad) of the semiconductor die. Each chip contact pad may be formed from or may include an electrically conductive material (e.g. a metal). The attaching of the semiconductor die on (or onto) the carrier may include arranging (or e.g. flipping) the semiconductor die so that the first lateral side surface (or front side) of the semiconductor die faces towards the carrier, and then re-melting (or soldering) the one or more solder structures to attach or connect each solder structure to at least one carrier connection structure of the carrier. Each solder structure may be electrically connected to a carrier connection structure (e.g. e.g. when an external voltage is applied to the carrier connection structure).

The semiconductor die may be attached to the at least one carrier connection structure at a first lateral side surface of the carrier. The carrier may be (or may include) a printed circuit board, a flip-chip substrate or a lead frame, for example. The carrier may include at least one carrier connection structure (which may refer to one or more carrier connection structures, or e.g. a plurality of carrier connection structures). Each carrier connection structure may extend from the first lateral side surface of the carrier towards (or to) an opposite second lateral side surface of the carrier. For example, each carrier connection structure may be configured to provide an electrical path between the first lateral side surface of the carrier and the opposite second lateral side surface of the carrier (e.g. when an external voltage is applied to the carrier connection structure).

The semiconductor die arranged on the carrier may be attached (or e.g. fixed) to the carrier via the at least one solder structure before dispensing 120 the fillet material. Before dispensing 120 the fillet material, a gap may be located between the semiconductor die and the carrier. For example, the gap may be located between the first lateral side surface of the semiconductor die and the first lateral side surface of the carrier. An average height of the gap between the first lateral side surface of the semiconductor die and the first lateral side surface of the carrier may be between 10 μm and 1000 μm (or e.g. between 40 μm and 500 μm, or e.g. between 40 μm and 150 μm), for example.

The method comprises dispensing 120 a fillet material at at least one edge of the semiconductor die (during or in a first fillet material dispensing process). The fillet material may include (or may be or is) a thixotropic material, wherein a viscosity of the (thixotropic) fillet material may decrease with increasing stress applied to the thixotropic material. For example, a viscosity of the (thixotropic) fillet material may decrease during dispensing of the fillet material at the at least one edge of the semiconductor die. After the fillet material has been dispensed at the at least one edge of the semiconductor die, a viscosity of the filler material formed at the at least one edge of the semiconductor die may increase. For example, a viscosity of the filler material located at the at least one edge of the semiconductor die after dispensing the filler material may be higher than a viscosity of the filler material during the dispensing of the filler material.

A thixotropic index of the fillet material may be greater than 1.0 (or e.g. greater than 1.5, or e.g. greater than 2). The thixotropic index of the fillet material may be a ratio between the viscosity of the filler material after (or directly after) dispensing the filler material (but before curing the filler material) and a viscosity of the filler material during the dispensing of the filler material. Due to the thixotropic index of the fillet material being greater than 1.0 (or e.g. greater than 1.5, or e.g. greater than 2), the fillet material may be (or may be considered to be, or referred to as) a high thixotropic material.

The fillet material may include filler particles embedded in a matrix material. For example, the filler particles may be at least partially (or completely) surrounded by the matrix material. The filler particles may be selected from at least one of the group comprising (or consisting of) silica particles (amorphous and/or crystalline forms), graphite particles, metallic particles such as alumina particles, silver particles, nickel particles, and boron nitride particles. For example, the filler particles may include one type of the particles in the group, or alternatively a combination of two or more types of particles in the group. At least 10% (or e.g. at least 20%, or e.g. at least 30%) of the (volume of) the fillet material may be filler particles for example. The remaining 90% (or e.g. 80%, or e.g. 70%) of the (volume of) the fillet material may be the matrix material. The matrix material may be a resin material. The matrix material may be selected from at least one of the group comprising (or consisting of) polyepoxies, polyacrylates, polyamide, polyanhydrides, polyamines, phenolics. For example, the matrix material may include one type of material in the group, or alternatively a combination of two or more types of materials from the group. Optionally, there may be no hardener additive. Alternatively, or optionally, the hardener material may be selected from one of the group comprising (or consisting of) amines, anhydrides, and imidazoles. For example, the hardener material may include one type of material in the group, or alternatively a combination of two or more types of materials from the group.

The fillet material may be dispensed 120 at the at least one edge of the semiconductor die so that the fillet material is formed on (e.g. directly on) and/or may cover the edge of the semiconductor die at which it is dispensed. For example, the fillet material may be formed on (e.g. directly on) and/or may cover the vertical side of the semiconductor die. Due to the thixotropy of the fillet material, spreading of the fillet material after being dispensed at the edge of the semiconductor die may be reduced (or minimized or substantially eliminated).

The fillet material may be dispensed 120 from a jetting dispenser, from a piston dispenser, from an auger dispenser, or from a pressure-time dispenser. Optionally, other processes for dispensing the fillet material may be used.

A maximum width of the fillet material from the edge of the semiconductor die after dispensing the fillet material may be less than 5.0 mm (or e.g. less than 4.0 mm, or e.g. less than 3.0 mm, or e.g. less than 2.0 mm). The maximum width of the fillet material may be the largest dimension of the dispensed fillet material located (or deposited or formed) at the edge of the semiconductor die measured from the edge of the semiconductor die in a direction substantially orthogonal (or perpendicular) to the edge of the semiconductor die, or in a direction substantially parallel to a lateral side surface of the carrier. Due to the thixotropy of the fillet material, a volume of fillet material spreading into the gap between the semiconductor die and the carrier may also be reduced or minimalized.

The fillet material may be dispensed 120 at a first edge of the semiconductor die and at an opposite second edge of the semiconductor die (during or in the first fillet material dispensing process), for example. For example, the fillet material may be dispensed 120 at the first edge of the semiconductor die and at the second edge of the semiconductor die before dispensing the underfill material.

The fillet material may be dispensed 120 at an edge (or each of the first edge and the second edge) of the semiconductor die so that the dispensed fillet material extends from a first corner of the edge to an opposite second corner of the edge at which the fillet material is dispensed. For example, the fillet material may cover the first corner and the second corner of the edge.

Optionally, the method 100 may further include curing the fillet material to form a fillet at the at least one edge (e.g. at each of the first edge and the second edge) of the semiconductor die before dispensing the underfill material. The fillet material may be cured by heating the fillet material or applying light to the fillet material. The fillet formed after curing may include the fillet material, which may be toughened or hardened by the curing process, for example. The at least one fillet formed by the fillet material after curing may have a smaller volume than the fillet material dispensed at the at least one edge before curing, although the reduction in volume may be small.

Alternatively or optionally, curing the fillet material to form the fillet may be carried out after dispensing the underfill material instead of before dispensing the underfill material.

The fillet material formable by (or formed by) the fillet material may extend from a first corner of the edge at which it is formed to an opposite second corner of the same edge. For example, the fillet material may cover the first corner and the second corner of the edge at which it is formed. Additionally the fillet material may cover (entirely) the edge at which it is formed.

A surface of the fillet formable by (or formed by) the fillet material at the first edge of the semiconductor die and at the second edge of the semiconductor die may have a non-vertical slope or gradient with respect to the surface of the carrier. For example, an angle between a slope at a middle of the fillet formed by the fillet material and a surface of the carrier may lie between 20° and 85° (or e.g. between 30° and 75°, or e.g. between 40° and 70°). The middle of the fillet may be a point at the surface of the fillet in a cross-section of the fillet. The cross-section of the fillet may be at a middle of the (at least one) edge of the semiconductor die. For example, the cross-section of the fillet may be a vertical cross-section (or plane) substantially perpendicular to the edge of the semiconductor die. For example, the cross-section of the fillet may be located at the center (or at a midpoint) of the edge at which the cross-section of the fillet is located. The point may be located at the surface of the fillet at 50% (or e.g. between 40% and 60%) of a height between a highest point of the fillet and a surface of the carrier. For example, the height between the highest point of the fillet and the surface of the carrier may be a distance measured in a substantially vertical direction (e.g. substantially parallel to the edge of the semiconductor die) between the highest point of the fillet and the surface of the carrier.

A maximum width of the at least one fillet formable by (or formed by) the fillet material from the at least one edge of the semiconductor die may be less than 5.0 mm (or e.g. less than 4.0 mm, or e.g. less than 3.0 mm, or e.g. less than 2.0 mm). For example, a maximum (or largest) width of a (or each) fillet formable (or formed by) the fillet material from an edge of the semiconductor die on which it is formed may be less than 5.0 mm (or e.g. less than 4.0 mm or e.g. less than 3.0 mm, or e.g. less than 2.0 mm).

The maximum width of the fillet may be measured at a middle portion of the at least one edge of the semiconductor die ignoring corner regions of the semiconductor die, for example. The middle portion of the edge of the semiconductor die may have a dimension of 30% (or 40%, or 50%, or less than 80%) of the total length (or size or dimension) of the edge of the semiconductor die, for example. The middle portion of the edge of the semiconductor die may be located equidistant (or half way) between corners regions of the semiconductor die formed by the edge of the semiconductor die.

The method 100 may further include dispensing 130 the underfill material into the gap between the semiconductor die and the carrier after dispensing the fillet material, or optionally after curing the fillet material.

The underfill material may be different from the fillet material, for example. The underfill material may be selected from at least one of the group comprising (or consisting of) polyepoxies, polyacrylates, polyamide, polyanhydrides, polyamines, phenolics, for example. For example, the underfill material may include one type of material in the group, or alternatively a combination of two or more types of materials from the group.

A viscosity of the underfill material during and/or after dispensing the underfill material, but before curing the underfill material may be less than or equal to 10 pascal-seconds (at 25° C.), for example. For example, a viscosity of the underfill material after dispensing the underfill but before curing the underfill material may be lower than a viscosity of the fillet material after dispensing the fillet material but before curing the underfill material.

The underfill material may be dispensed 130 (or deposited or introduced) into the gap between the semiconductor die and the carrier from a dispensing edge of the semiconductor die. The dispensing edge of the semiconductor die may be orthogonal (e.g. perpendicular) to the first edge of the semiconductor die and the second edge of the semiconductor die. For example, the dispensing edge may be a substantially vertical side of the semiconductor die located orthogonally to the first edge of the semiconductor die and the second edge of the semiconductor die.

The underfill material may be dispensed 130 from the dispensing edge of the semiconductor die towards an opposite third edge of the semiconductor die. The third edge of the semiconductor die may be orthogonal (e.g. perpendicular) to the first edge of the semiconductor die and the second edge of the semiconductor die. For example, the third edge may be a substantially vertical side of the semiconductor die located orthogonally to the first edge of the semiconductor die and the second edge of the semiconductor die.

The underfill material may spread from the dispensing edge of the semiconductor die towards the third edge of the semiconductor die. The spreading of the underfill material may occur due to the low viscosity of the underfill material. The underfill material may substantially fill the gap between the semiconductor die and the carrier. For example, the dispensed underfill material may fill at least 70% (or e.g. at least 80%, or e.g. at least 90%) of the volume of the gap between the semiconductor die and the carrier excluding solder structures located in the gap. The underfill material may be dispensed 130 so that the underfill material located in spaces between the solder structures. For example, the underfill material may laterally surround the solder structures located in the gap between the semiconductor die and the carrier.

The underfill material may be dispensed 130 from a jetting dispenser, from a piston dispenser, from an auger dispenser, or from a pressure-time dispenser. Optionally, other processes for dispensing the underfill material may be used.

The method 100 may further include curing the underfill material by heating the underfill material or applying light to the underfill material. If the fillet material was not cured before dispensing the underfill material (e.g. if curing the fillet material was omitted before dispensing the underfill material), the fillet material and the underfill material may be cured in the same curing process after dispensing the underfill material.

The curing of the underfill material may cause a fillet formable (or e.g. formed by, or e.g. comprising) the underfill material to be formed at the dispensing edge of the semiconductor die. For example, the fillet formable (or formed) by the underfill material may be located at or on the dispensing edge (e.g. the vertical side) of the semiconductor die. If the underfill material is formed at the third edge of the semiconductor die (e.g. by spreading from the dispensing edge to the third edge), the curing of the underfill material may cause a fillet formable (or e.g. formed by, or e.g. comprising) the underfill material to be formed at the third edge of the semiconductor die. For example, the fillet formable (or formed) by the underfill material may be located at or on the third edge (e.g. the vertical side) of the semiconductor die.

A surface of the fillet formable by (or formed by) the underfill material at the dispensing edge of the semiconductor die and/or at the third edge of the semiconductor die may have a non-vertical slope or gradient with respect to the surface of the carrier. For example, an angle between a slope at a middle of the fillet formed by the underfill material and a surface of the carrier may lie between 20° and 85° (or e.g. between 30° and 75°, or e.g. between 40° and 70°). The middle of the fillet may be a point at the surface of the fillet in a cross-section of the fillet. The cross-section of the fillet may be at a middle of the at least one edge of the semiconductor die. For example, the cross-section of the fillet may be a vertical cross-section substantially perpendicular to the edge of the semiconductor die. For example, the cross-section of the fillet may be located at the center (or at a midpoint) of the dispensing edge of the semiconductor die. The point may be located at the surface of the fillet at 50% (or e.g. between 40% and 60%) of a height between a highest point of the fillet and a surface of the carrier. For example, the height between the highest point of the fillet and the surface of the carrier may be a distance measured in a substantially vertical direction (e.g. substantially parallel to an edge of the semiconductor die) between the highest point of the fillet and the surface of the carrier.

A maximum width of the at least one fillet formable by (or formed by) the underfill material from the at least one edge of the semiconductor die may be less than 5.0 mm (or e.g. less than 3.0 mm, or e.g. less than 2.0 mm). For example, a maximum (or largest) width of a (or each) fillet formable (or formed by) the underfill material from an edge of the semiconductor die on which it is formed may be less than 5.0 mm (or e.g. less than 4.0 mm, or e.g. less than 3.0 mm, or e.g. less than 2.0 mm). For example, a maximum width of the at least one fillet formable by the underfill at a middle portion of the at least one edge of the semiconductor die may be less than 5.0 mm (or e.g. less than 4.0 mm, or e.g. less than 3.0 mm, or e.g. less than 2.0 mm). The middle portion of the edge of the semiconductor die may have a dimension of 30% (or 40%, or 50%, or less than 80%) of the total length (or size or dimension) of the edge of the semiconductor die, for example. The middle portion of the edge of the semiconductor die may be located equidistant (or half way) between two opposite edges of the semiconductor die. For example, the two opposite edges of the semiconductor die may be orthogonal to the edge at which the cross-section of the fillet is located. For example, the middle portion of the dispensing edge of the semiconductor die may be located equidistant (or half way) between the first edge of the semiconductor die and the second edge of the semiconductor die.

Optionally, the method may optionally further include dispensing the fillet material (during or in a second fillet material dispensing process) at the third edge of the semiconductor die and/or at the dispensing edge of the semiconductor die after dispensing the underfill material. For example, the fillet material may be dispensed at the dispensing edge of the semiconductor die after dispensing the underfill material. For example, at least part of the fillet material may be dispensed onto (or e.g. over, or e.g. on, or e.g. to cover) at least part of the underfill material already dispensed or located at the dispensing edge of the semiconductor die. Additionally or optionally, at least part of the fillet material may be dispensed onto (or e.g. over, or e.g. on, or e.g. to cover) at least part of the underfill material already located at the third edge of the semiconductor die.

The fillet material may be cured after dispensing the fillet material at the dispensing edge of the semiconductor die or at the third edge of the semiconductor die to form a fillet formable by (or formed by or comprising) the fillet material at the dispensing edge of the semiconductor die and/or at the third edge of the semiconductor die.

Optionally, the fillet material and the underfill material may be cured in the same curing process after dispensing the fillet material at the dispensing edge of the semiconductor die or at the third edge of the semiconductor die.

Optionally, the fillet formed at the dispensing edge and/or at the third edge of the semiconductor die after curing may include the cured fillet material located on the cured underfill material. For example, the fillet formed at the dispensing edge and/or at the third edge may include a bottom (or lower) fillet portion formable by (or formed by or comprising) the underfill material and a top (or upper) fillet portion formable by (or formed by or comprising) the fillet material.

Optionally, the fillet material (dispensed during or in the first fillet material dispensing process) may be dispensed to form a fillet structure comprising the fillet material between the first semiconductor die and a neighboring second semiconductor die arranged on the carrier. For example, the fillet material may be dispensed to form a fillet structure between an edge of the first semiconductor die and a neighboring (or adjacent) edge of the second semiconductor die. For example, a first portion of the fillet structure may be dispensed at an (second) edge of the first semiconductor die and a second portion of the fillet structure may be dispensed at an (first) edge of the second semiconductor die. An average distance between the neighboring (or adjacent) edges of the first semiconductor die and the second semiconductor die may be greater than 0.1 mm (or e.g. greater than 0.5 mm, or e.g. greater than 1.0 mm).

Optionally, the method may be used to form an electrical device comprising a plurality of dies. For example, the examples described herein may be used for forming a plurality of fillets for a plurality of semiconductor dies. For example, the method may include dispensing the fillet material (during the first fillet material dispensing process) at a plurality of first edges of a plurality of semiconductor dies and at a plurality of opposite second edge of the plurality of semiconductor dies. A fillet structure may be formed between neighboring semiconductor dies of the plurality of semiconductor dies. After dispensing the fillet material at the first edges of the plurality of semiconductor dies and the second edges of the plurality of semiconductor dies, underfill material may be dispensed (optionally simultaneously) at a plurality of dispensing edges of the plurality of semiconductor dies. Optionally, the plurality of semiconductor dies may be arranged on the carrier so that the dispensing edges of semiconductor dies face the same direction. The dispensing material may spread into (or through) the plurality of gap between the plurality of semiconductors does and the carrier. For example, the dispensing material may spread from the plurality of dispensing edges towards a plurality of third edges of the plurality of dies. After dispensing the underfill material, the underfill material and the fillet material may be cured. Alternatively, the fillet material may be cured before dispensing the underfill material.

Optionally, after dispensing and curing the underfill material, the filler material may be dispensed (during the second fillet material dispensing process) at a plurality of third edges of the plurality of semiconductor dies.

In all the examples described herein, the (or each) edge of the semiconductor die may refer to a substantially vertical side (or vertical edge) of the semiconductor die substantially orthogonal to the first lateral side surface of the semiconductor die and the second lateral side surface of the semiconductor die. A substantially rectangular (or square) semiconductor die may have four edges substantially orthogonal to the first lateral side surface of the semiconductor die and the second lateral side surface of the semiconductor die, for example. The edge (or vertical edge) of the semiconductor die may result from separating (or dicing) the semiconductor die from other semiconductor dies of a semiconductor wafer, for example.

A lateral side surface of the semiconductor die may be a substantially even plane (e.g. neglecting unevenness of the semiconductor structure due to the manufacturing process and trenches). In comparison to a basically vertical edge of the semiconductor die, the lateral side surface may be a basically horizontal surface extending laterally. The lateral side surface of the semiconductor die may be substantially orthogonal or perpendicular to the vertical edge of the semiconductor die. The lateral dimension of the lateral surface of the semiconductor die may be more than 100 times larger (or more than 1000 times or more than 10000 times) than a basically vertical edge of the semiconductor die, for example.

The method described in connection with FIG. 1 may use (at least) two different materials, instead of (only) underfills, to underfill chip gaps and to form protective fillets around the die edges particularly in the die corners where stress levels are the highest. Thus, unwanted spreading of the underfill, which negatively impacts keep-out-zones, and which is primarily due to simultaneously providing underfill for chip gaps and for forming protective fillets, may be avoided, for example. In particular, underfill requirements may drive the underfill viscosity to be low, while fillet requirements may drive the filler loading to be high for fillet strength. Due to the use of only one underfill material for both the fillets and the underfill, the low viscosity of the underfill material may result in high wetting of the substrate (e.g. the carrier), while the filleting requirement may result in large material volumes. To avoid forming voids in the chip gap, the underfill may be dispensed on one side of the die thereby creating an asymmetric keep-out-zone with a very large dimension on one side of the die (termed the tongue side 206C). These large keep-out-zones, in addition to increasing package sizes, pose additional constraints on multi-chip packages. For example, merging underfill keep-out-zones for multiple dies may have to be carefully planned out as many potential die arrangements cause interference in the underfilling of one or multiple dies.

By using at least two different materials as described in connection with FIG. 1, various complexities may be avoided. For example, the forming of openings in the solder resist to a ground plane which restricts package design, a dispensing of a barrier material which adds cost and process complexity, and/or combining multiple passes of low volume dispenses which impacts throughput, may be avoided, for example.

The various examples described herein provide a two-material process where the competing requirements (for providing an underfill and protective fillets) are met separately by (at least) two materials, thereby decoupling the material properties and allowing for minimizing the underfill spread on all die sides, for example.

In the examples described herein, (at least) two primary dispense processes may be used for products with a low flow distance. The dispense processes may include a prefillet dispense of a heavily loaded high-thixotropic heavily-loaded material and an underfill dispense of a low-viscosity underfill. The prefillet may be first applied on the sides perpendicular to the desired underfill dispense side, thereby restricting the subsequent underfill flow to proceed under the die only. The high thixotropy may constrain the spread of this material thereby resulting in low keep-out-zones on (at least) two sides of the die (206A, 206B), for example.

Freed from the need to provide material for filleting, the underfill dispense may then also be a low volume dispense, thereby achieving low keep-out-zones on the remaining 2 sides of the die. For products with high flow distances (e.g. longer than 15 mm) and/or associated high sidewall fillet stresses, an additional fillet dispense on either the side opposite the underfill dispensing side and/or the underfill dispense side may be carried out.

Due to the examples described herein, the need for solder resist openings may be avoided. Solder resist openings may impact product design because a ground layer must be included immediately below the solder resist. Additionally, these openings may have limited effectiveness as the resistance to wetting is quickly overcome when sufficient underfill builds up at the edge of the opening. For this reason, these openings may only be used to stop the tails of the underfill spread, for example. Furthermore, the areas required for the openings must be part of the keep-out-zone definition which limits the effectiveness of this approach.

Due to the examples described herein, other additional processes may also be avoided. For example, the dispensing of barrier materials (such as the jetting and flash-cure of an ink barrier) may involve adding entire processes. This approach may suffer from the same limitations as the solder resist openings. The examples described herein do not involve a ground plane layer and, thus, may be less restrictive on package design than the solder resist opening options, for example.

In the examples described herein, the prefillet dispense 120 may be incorporated into a standard underfill process flow. Thus, it does not involve an extra process like the dispensing of barrier materials. Furthermore, the keep-out-zones may be reduced on all four sides of the die. For some use-cases like intermediate die-to-die spacing on multi-chip packages, the examples described herein may act as an enabler of die-to-die configurations that are not possible to achieve with the examples described herein. Furthermore, the die-to-component spacing on complex packages may be reduced due to the reduced keep-out-zones. These components may be other electronic components that may include capacitors, inductors, resistors, electronic modules, etc.

In addition, the materials may be chosen to ensure the compatibility of the two materials (the underfill material and the fillet material), as well as suitability of the two materials for processing (dispensability, outgassing). The fillet material may be chosen to balance the prefillet thixotropy to avoid capillary action while still wetting the die edges, and to meet targets for mechanical properties in the cured state. The underfill material may be selected based on material requirements of the underfill in its liquid state (viscosity, contact angle), as well as to meet targets for mechanical properties in the cured state. Processes may be applied to achieve low volumes required for low keep-out-zones, and for the dispensing of highly-loaded high-thixotropic materials.

FIGS. 2A to 2D show schematic illustrations of a method for forming an electrical device according to an example. For example, the method may include dispense sequences on an electrical device comprising a single die (e.g. single die products).

Figure 2A:
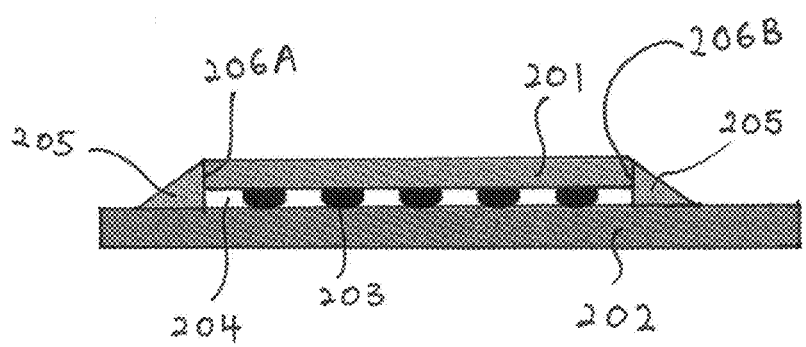
FIGS. 2A to 2D show schematic illustrations of a method for forming an electrical device.

As shown in FIG. 2A, the method may comprise attaching a semiconductor die 201 on a carrier 202. As described in connection with FIG. 1, the semiconductor die 201 may be attached to the carrier 202 by a flip-chip connection. For example, the attaching of the semiconductor die 201 on (or onto) the carrier 202 may include soldering the semiconductor die to the carrier so that at least one solder structure 203 is located in the gap 204 between the semiconductor die 201 and the carrier 202.

Figure 2B:
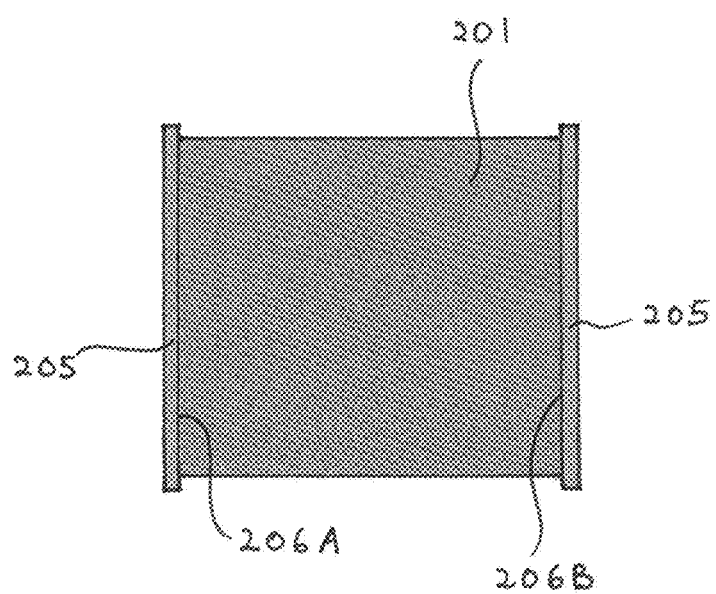

As shown in FIG. 2A (top view) and FIG. 2B (cross-sectional view), the method further comprises dispensing a fillet material 205 at at least one edge of the semiconductor die 201 arranged on the carrier. As described in connection with FIG. 1, the fillet material 205 may be dispensed at a first edge 206A of the semiconductor die 201 and at an opposite second edge 206B of the semiconductor die 201, for example.

The pre-fillets may be dispensed on the sides (206A, 206B) perpendicular to the chosen underfill dispense (or dispensing) side. This material (the fillet material 205) may wet the die and form the side fillets, and the thixotropic nature of the fillet material 205 may resist the capillary force created by the chip gap, for example. These fillets may form continuous side barriers that constrain the underfill and not allow it to spread out on these two sides (206A, 206B), for example. Additionally, this material may form the fillets at all four die corners, which are typically the locations of the highest stress on the die, for example.

Optionally, the method may further include curing the fillet material 205 to form a first fillet at the first edge of the semiconductor edge of the semiconductor die and a second fillet at the second edge of the semiconductor die before dispensing the underfill material. Alternatively or optionally, curing the fillet material may be carried out after dispensing the underfill material instead of before dispensing the underfill material.

Figure 2C:
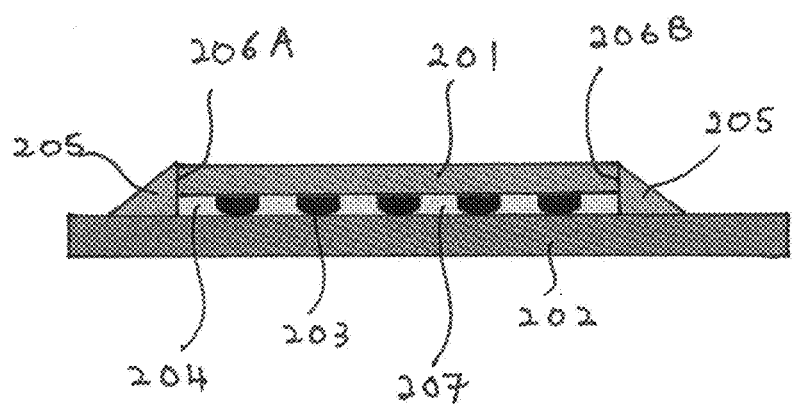
Figure 2D:
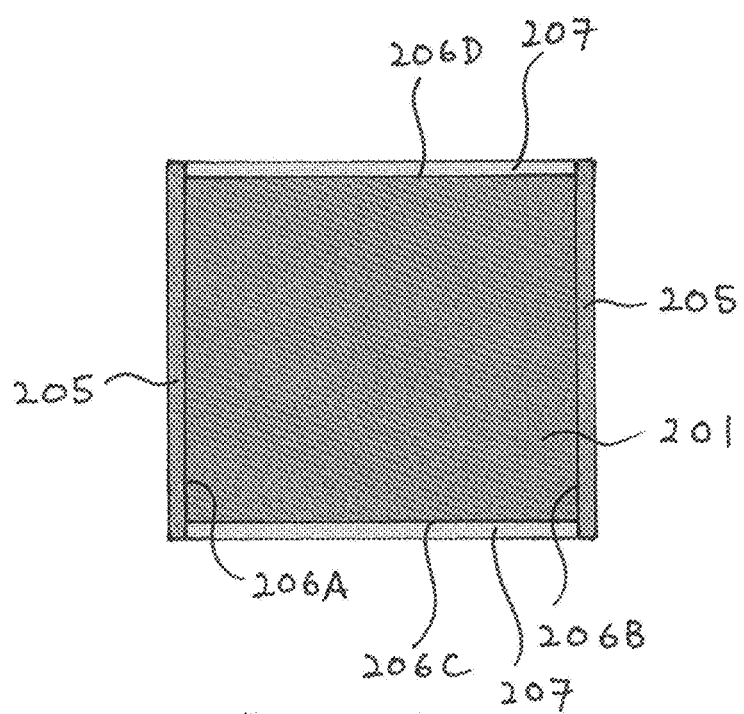

As shown in FIGS. 2C (top view) and 2D (cross-sectional view), the method further comprises dispensing an underfill material 207 into the gap 204 between the semiconductor die 201 and the carrier 202 after dispensing the fillet material 205.

The underfill material may be dispensed (or deposited or introduced) into the gap 204 between the semiconductor die 201 and the carrier 202 from a dispensing edge 206C of the semiconductor die 201. The dispensing edge 206C of the semiconductor die 201 may be orthogonal to the first edge 206A of the semiconductor die 201 and the second edge 206B of the semiconductor die 201.

The underfill material 207 may be dispensed from the dispensing edge 206C of the semiconductor die 201 towards an opposite third edge 206D of the semiconductor die 201. The third edge 206D of the semiconductor die 201 may be orthogonal to the first edge 206A of the semiconductor die 201 and the second edge 206B of the semiconductor die 201.

The dispensed underfill material 207 may spread from the dispensing edge 206C of the semiconductor die 201 towards the third edge 206D of the semiconductor die 201. For example, the dispensed underfill material 207 may substantially fill the gap between the semiconductor die 201 and the carrier 202. For example, the dispensed underfill material may fill at least 70% (or e.g. at least 80%, or e.g. at least 90%) of the volume of the gap between the semiconductor die and the carrier excluding solder structures located in the gap.

The underfill material may be dispensed on the chosen side (e.g. the dispensing edge 206C) with sufficient volume to fill (or substantially fill) the chip gap and to form the remaining fillets (on sides 206C, 20CD). For products with low sidewall stresses and/or low flow distances, this is may be the final process and further fillet dispensing processes may be avoided.

An average dimension of the edges of the semiconductor die may lie between 3.0 mm and 100.0 mm, for example. Semiconductor dies with low flow distances may refer to semiconductor dies, where an average lateral dimension of the edges of the semiconductor die 201 is less than 15 mm.

The underfill material 207 may be dispensed at the dispensing edge 206C of the semiconductor die 201 after curing the fillet material 205. If the fillet material 205 was not cured before dispensing the underfill material 207 (e.g. if curing the fillet material was omitted before dispensing the underfill material 207), the fillet material 205 and the underfill material 207 may be cured in the same curing process after dispensing the underfill material 207.

More details and aspects are mentioned in connection with the examples described above or below. The examples shown in FIGS. 2A to 2D may comprise one or more optional additional features corresponding to one or more aspects mentioned in connection with the proposed concept or one or more examples described above (e.g. FIG. 1) or below (FIGS. 3A to 7).

Figure 3A:
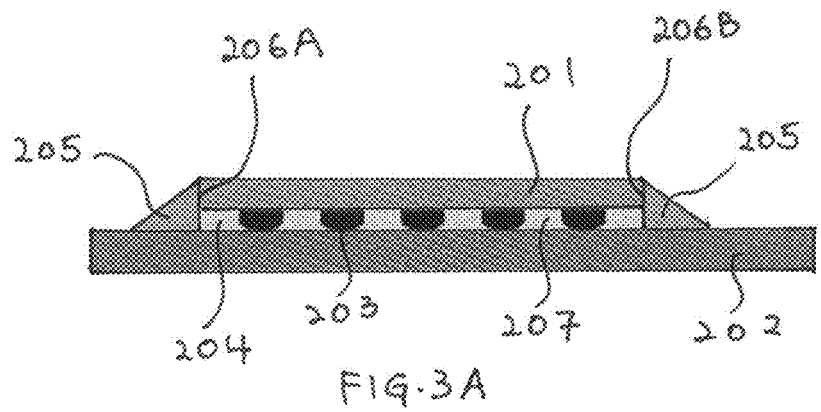
FIGS. 3A and 3B show schematic illustrations of a further method for forming an electrical device.
Figure 3B:
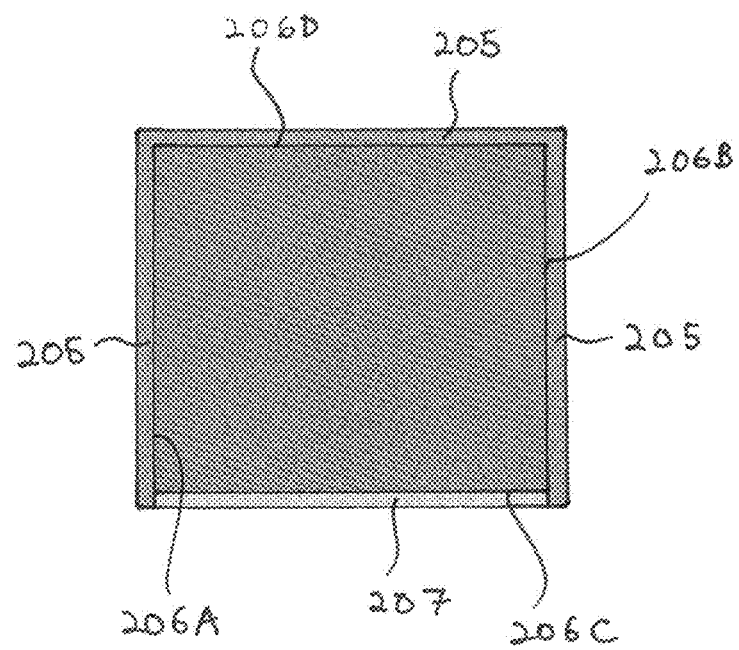

FIG. 3A (cross-section) and FIG. 3B (top view) show schematic illustrations of a further method for forming an electrical device according to an example.

The method may include one or more or all of the features of the method described in connection with FIGS. 2A to 2D. In addition, the method may further include dispensing the fillet material 205 (during or in a second fillet material dispensing process) at the third edge 206D of the semiconductor die 201 after dispensing the underfill material 207, for example.

For products with high sidewall stresses, the two-part process may not be sufficient. For example, either the underfill may not form sufficiently strong fillets and/or the underfill may not form a sufficient fillet on the side opposite to the dispense side (at third edge 206D), or the spread of the underfill on the dispense side 206C may not be as low as desired. In either or any of these cases, a further process for the dispensing of the prefillet (with fillet material) may be carried out. The underfill fillet on the side opposite to the dispense side may be insufficient, in which case a fillet dispense may be added. This may be similar to the last part in the current process for underfilling parts with long flow distances.

It may be possible that the underfill material 207 dispensed from the dispensing edge 206C of the semiconductor die may not reach the third edge 206D of the semiconductor die 201, (e.g. due to long flow distances) for example. In which case, the fillet material 205 may be dispensed at (or e.g. directly on) the third edge 206D of the semiconductor die 201. It may alternatively be possible that the underfill material 207 reaching the third edge 206D of the semiconductor die 201 may be insufficient to form a fillet at or covering the third edge 206D of the semiconductor die. In which case, at least part of the fillet material 205 dispensed (during or in the second fillet material dispensing process) at the third edge 206D may be dispensed onto (or e.g. over, or e.g. on, or e.g. to cover) at least part of the underfill material 207 at the third edge 206D of the semiconductor die 201.

The dispensing of the underfill material 207 may lead to an asymmetrical distribution of the underfill material 207 at the dispensing edge 206C and at the third edge 206D. For example, more underfill material 207 may accumulate at the dispensing edge 206C during or after dispensing the underfill material 207 than at the third edge 206D. If the underfill material 207 dispensed at the dispensing edge 206C is sufficient to form a fillet at the dispensing edge 206C, no fillet material 205 is dispensed at the dispensing edge 206C after dispensing the underfill material 207. Optionally, if the underfill material 207 dispensed at the dispensing edge 206C is insufficient to form a fillet at the dispensing edge 206C, fillet material 205 may be dispensed at the dispensing edge 206C after dispensing the underfill material 207. Optionally, at least part of the fillet material 205 may be dispensed onto (or e.g. over, or e.g. on,) at least part of the underfill material 207 already dispensed or located at the dispensing edge 206C of the semiconductor die 201.

The fillet material 205 may be cured after dispensing the fillet material 205 at the third edge 206D of the semiconductor die 201 and/or at the dispensing edge 206C of the semiconductor die 201 to form a fillet formable by the fillet material 205 at the third edge 206D of the semiconductor die 201 and/or at the dispensing edge 206C of the semiconductor die 201. Optionally, the fillet material 205 and the underfill material 207 may be cured in the same curing process after dispensing the fillet material 205 at the dispensing edge 206C of the semiconductor die 201 and/or at the third edge 206D of the semiconductor die 201.

Semiconductor dies with long flow distances may refer to semiconductor dies, where an average lateral dimension of the edges of the semiconductor die 201 is greater than 15 mm.

More details and aspects are mentioned in connection with the examples described above or below. The examples shown in FIGS. 3A to 3B may comprise one or more optional additional features corresponding to one or more aspects mentioned in connection with the proposed concept or one or more examples described above (e.g. FIGS. 1 to 2D) or below (FIGS. 4A to 7).

Figure 4A:
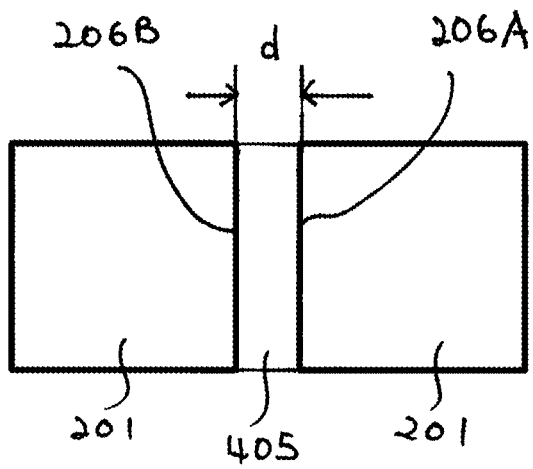
FIGS. 4A to 4C show schematic illustrations of a method for forming an electrical device with more than one semiconductor die.
Figure 4B:
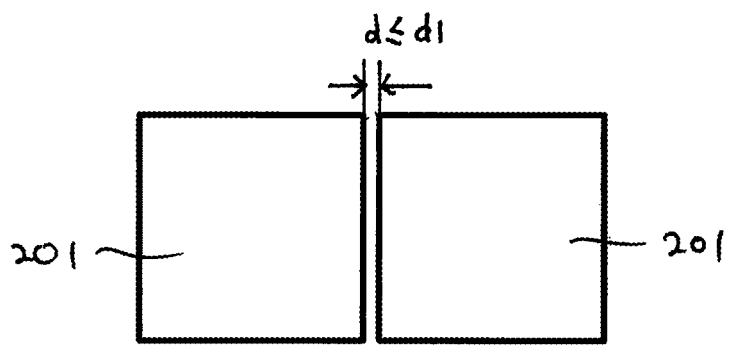
Figure 4C:
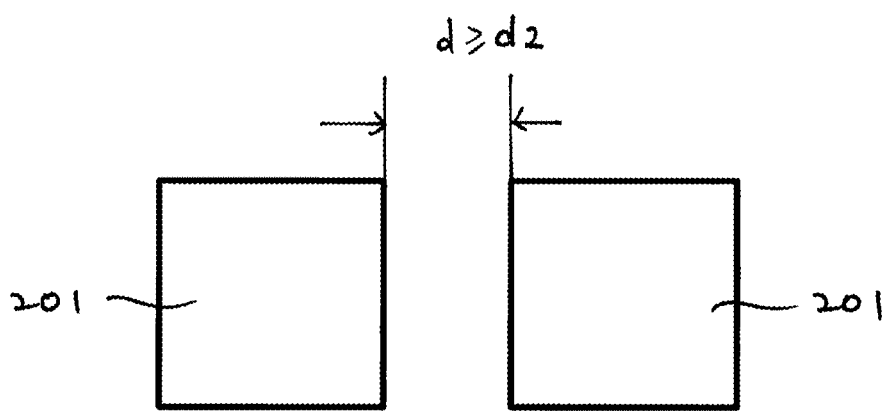

FIGS. 4A to 4C show top view schematic illustrations of a method for forming an electrical device according to an example.

The examples described may be extended to multi-chip packages (MCPs) where undesirable flow of underfill material may put restrictions on die-to-die spacing and die-locations configurations. For example, restrictions on die-to-die spacing, d, may be avoided.

The fillet material may be dispensed (e.g. during or in the first fillet material dispensing process) to form a fillet structure 405 comprising the fillet material between the first semiconductor die 201 and a neighboring second semiconductor die 201 arranged on the carrier. For example, the fillet material may be dispensed to form the fillet structure 405 between an edge of the first semiconductor die 201 and a neighboring (or adjacent) edge of the second semiconductor die 201. For example, a first portion of the fillet structure 405 may be dispensed at a second edge 206B of the first semiconductor die 201 and a second portion of the fillet structure 405 may be dispensed at a first edge 206A of the second semiconductor die 201.

For example, an average distance, d, between the neighboring (or adjacent) edge of the first semiconductor die 201 and the second semiconductor die 201 may lie between 0.5 mm and 6.0 mm (or e.g. between 1.0 mm and 5.0 mm, or e.g. between 2.0 mm and 3.0 mm). The use of a high thixotropic index (HTI) fillet material in the space between the dies enables die configurations with $d1<d<d2$, for example.

As shown in FIGS. 4B and 4C (e.g. use-case 1), the intermediate die-to-die spacing may be restricted by using a single underfill dispense material.

With the examples described herein, the distance between neighboring semiconductor dies (the die-to-die spacing) does not have to be below a lower threshold (e.g. $d \leq d1$) such that the two dies can be treated as one as shown in FIG. 4B. d1 may be a value which is greater than 0.5 mm, for example.

With the examples described herein, the distance between neighboring semiconductor dies (the die-to-die spacing) does not have to be above a higher threshold (e.g. $d \leq d2$) such that the keep-out-zones are completely separated, effectively decoupling the underfilling of both dies as shown in FIG. 4B. d2 may be a value which is less than 6.0 mm, for example.

More details and aspects are mentioned in connection with the examples described above or below. The examples shown in FIGS. 4A to 4C may comprise one or more optional additional features corresponding to one or more aspects mentioned in connection with the proposed concept or one or more examples described above (e.g. FIGS. 1 to 3B) or below (FIGS. 5A to 7).

Figure 5A:
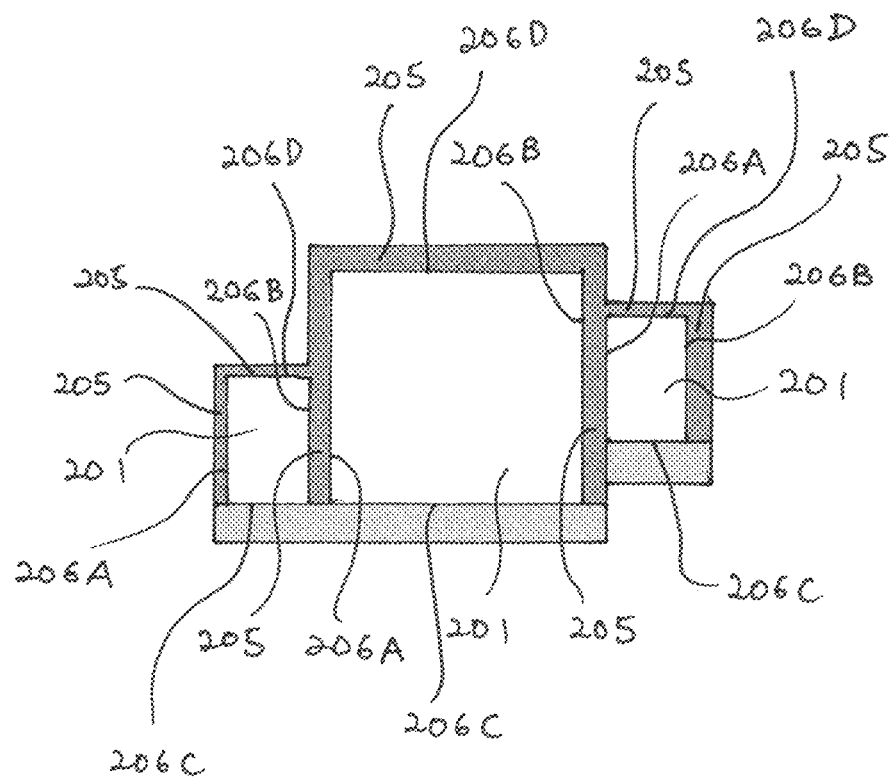
FIGS. 5A to 5B show schematic illustrations of a method for forming an electrical device with a plurality of semiconductor dies.
Figure 5B:
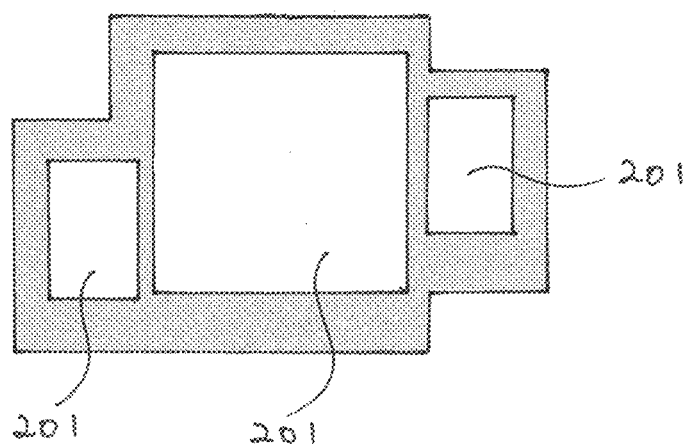

FIGS. 5A and 5B show top view schematic illustrations of a method for forming an electrical device according to an example. The method may be used to form an electrical device comprising a plurality of dies 201, for example.

As shown in FIG. 5A, the method may include attaching the plurality of semiconductor dies 201 on the carrier. After attaching the plurality of semiconductor dies 201 on the carrier, the method may include dispensing the fillet material 205 (during a first fillet material dispensing process) at a plurality of first edges 206A of the plurality of semiconductor dies 201 and at plurality of opposite second edges 206B of the plurality of semiconductor dies 201. For example, a first portion of each fillet structure between neighboring semiconductor dies may be dispensed at a second edge 206B of the first semiconductor die 201 and a second portion of the fillet structure may be dispensed at a first edge 206A of the neighboring second semiconductor die 201.

An average distance between the neighboring (or adjacent) edges of the neighboring semiconductor dies of the plurality of semiconductor dies may be greater than 0.1 mm, for example.

After dispensing the fillet material 205 at the first edges of the plurality of semiconductor dies and at the second edges of the plurality of semiconductor dies, underfill material 207 may be dispensed at the dispensing edges 206C (also referred to as tongue edges) of the plurality of semiconductor dies 201. Optionally, the plurality of semiconductor dies 201 may be arranged on the carrier so that the dispensing edges 206C of semiconductor dies 201 face the same direction. Furthermore, the underfill flow may be guided in a direction from the dispensing edges 206C of the plurality of dies towards (or to) the third edges 206D of the plurality of dies.

The filler material 205 dispensed during the first fillet material dispensing process may be cured to form a plurality of fillets formable by the filler material 205 at the first edges 206A of the plurality of semiconductor dies 201 and at the second edges 206B of the plurality of semiconductor dies 201. Optionally, the underfill material 207 dispensed during the second fillet material dispensing process may be cured to form a plurality of fillets formable by the underfill material 207 at the dispensing edges 206C of the plurality of semiconductor dies 201 of the plurality of semiconductor dies 201.

Optionally, after dispensing and/or curing the underfill material 207, the filler material 205 may be dispensed (during a second fillet material dispensing process) at the plurality of third edges 206D of the plurality of semiconductor dies 201. Optionally, at least part of the fillet material 205 dispensed at the third edges 206D of the plurality of semiconductor dies 201 may be dispensed onto (or e.g. over, or e.g. on, or e.g. to cover) at least part of any underfill material 207 at the third edges 206D of the plurality of semiconductor dies 201.

Additionally or optionally, the fillet material 205 (during the second fillet material dispensing process or a subsequent fillet material dispensing process) may be dispensed at the dispensing edges 206C of the plurality of semiconductor dies 201 after dispensing the underfill material 207. Optionally, at least part of the fillet material 205 dispensed at the dispensing edges 206C of the plurality of semiconductor dies 201 may be dispensed onto (or e.g. over, or e.g. on, or e.g. to cover) at least part of any underfill material 207 at the dispensing edges 206C of the plurality of semiconductor dies 201.

The examples described in connection with FIG. 5A may be applied to higher count multi-chip packages (MCPs), by guiding underfill flow in one-direction for all dies (from tongue to back-wall). This may be achieved by the dispensing sequences described in connection with FIG. 5A. Pre-fillet material may be dispensed on the side walls to stop any sideways flow (vertical edges), followed by underfill on the tongue side for all dies and, lastly, if necessary, on the back-wall (e.g. the third edges 206D). Thus, fillets formable by only underfill material which have larger widths (and formed on all sides of the semiconductor dies) as shown in FIG. 5B may be avoided, for example.

More details and aspects are mentioned in connection with the examples described above or below. The examples shown in FIGS. 5A to 5C may comprise one or more optional additional features corresponding to one or more aspects mentioned in connection with the proposed concept or one or more examples described above (e.g. FIGS. 1 to 4C) or below (FIGS. 6 to 7).

Figure 6:
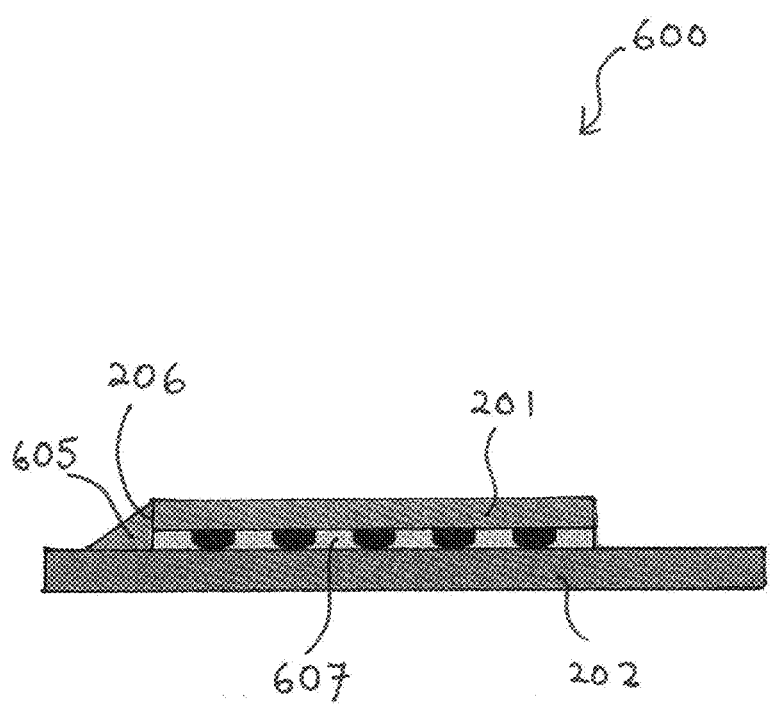
FIG. 6 shows a schematic illustration of an electrical device.

FIG. 6 shows a schematic illustration of an electrical device 600 according to an example.

The electrical device 600 comprises a semiconductor die 201 arranged on a carrier 202. The electrical device 600 further comprises at least one fillet 605 located at at least one edge 206 of the semiconductor die 201. The at least one fillet 605 is formable by a thixotropic fillet material. The electrical device 600 further comprises an underfill material located in a gap between the semiconductor die 201 and the carrier 202.

Due to the electrical device comprising at least one fillet formable by the thixotropic fillet material, underfill material volumes may be reduced and sizes of keep out zones of the electrical device may be reduced. Thus, the size of the electrical device may be reduced, for example, The at least one fillet is formable by (or may be formed by) the thixotropic fillet material. In other words, the material of the at least one fillet has one or properties that can be formed by the thixotropic fillet material.

The thixotropic fillet material may be similar or identical to the fillet material described in connection with FIGS. 1A to 5B. The thixotropic fillet material may be different from the underfill material, for example.

The thixotropic fillet material may include filler particles embedded in a matrix material. For example, the filler particles may be at least partially (or completely) surrounded by the matrix material. The filler particles may be selected from at least one of the group comprising (or consisting of) silica particles (amorphous and/or crystalline forms), graphite, metallic particles such as alumina, silver, nickel, and boron nitride particles. For example, the filler particles may include one type of the particles in the group, or alternatively a combination of two or more types of particles in the group. At least 10% (or e.g. at least 20%, or e.g. at least 30%) of the (volume of) the fillet material may be filler particles for example. The remaining 90% (or e.g. 80%, or e.g. 70%) of the (volume of) the fillet material may be the matrix material. The matrix material may be selected from at least one of the group comprising (or consisting of) polyepoxies, polyacrylates, polyamide, polyanhydrides, polyamines, phenolics. For example, the matrix material may include one type of material in the group, or alternatively a combination of two or more types of materials from the group. Optionally, there may be no hardener additive. Alternatively or optionally, the hardener material may be selected from one of the group comprising (or consisting of) amines, anhydrides, and imidazoles. For example, the hardener material may include one type of material in the group, or alternatively a combination of two or more types of materials from the group.

The underfill material 607 may be selected from at least one of the group comprising (or consisting of) polyepoxies, polyacrylates, polyamide, polyanhydrides, polyamines, phenolics, for example. For example, the underfill material 607 may include one type of material in the group, or alternatively a combination of two or more types of materials from the group.

The underfill material 607 may fill at least 70% (or e.g. at least 80%, or e.g. at least 90%) of the volume of the gap between the semiconductor die 201 and the carrier 202 excluding solder structures located in the gap.

A first fillet 605 formable by the thixotropic fillet material may be located at a first edge of the semiconductor die 201 and a second fillet formable by the thixotropic fillet material may be located at an opposite second edge of the semiconductor die 201, for example.

The electrical device may include a fillet structure formable by the thixotropic fillet material located between the (first) semiconductor die and a neighboring second semiconductor die. A first portion of the fillet structure may form a fillet 605 located at an edge of the first semiconductor die 201, and a second portion of the fillet structure may form a fillet 605 located at an edge of the second semiconductor die 201.

An average distance between the first semiconductor die and the second semiconductor die may be greater than 0.1 mm (or e.g. greater than 0.2 mm, or e.g. greater than 0.4 mm).

The carrier may be a printed circuit board, a flip-chip substrate or a lead frame, for example.

The semiconductor die 201 may be connected to the carrier 202 via at least one solder structure located in the gap between the semiconductor die 201 and the carrier 202. The at least one solder structure (which may refer to one or more solder structures, or e.g. a plurality of solder structures) may be arranged on a first lateral side surface (e.g. a front side) of the semiconductor die 201. The at least one solder structure may be a solder bump or a solder ball, for example.

An angle between a slope at a middle of the fillet 605 formed by the fillet material and a surface of the carrier may lie between 20° and 85° (or e.g. between 30° and 75°, or e.g. between 40° and 70°). The middle of the fillet 605 may be a point at the surface of the fillet in a cross-section of the fillet. The cross-section of the fillet 605 may be at a middle of the edge 206 of the semiconductor die 201. For example, the cross-section of the fillet 605 may be a vertical cross-section substantially perpendicular to the edge 206 of the semiconductor die 201. For example, the cross-section of the fillet may be located at the center (or at a midpoint) of the edge at which the cross-section of the fillet is located. The point may be located at the surface of the fillet at 50% (or e.g. between 40% and 60%) of a height between a highest point of the fillet and a surface of the carrier. For example, the height between the highest point of the fillet and the surface of the carrier may be a distance measured in a substantially vertical direction (e.g. substantially parallel to an edge of the semiconductor die) between the highest point of the fillet and the surface of the carrier.

A maximum (or average) width of the at least one fillet formable by (or formed by) the fillet material from the at least one edge of the semiconductor die may be less than 5.0 mm (or e.g. less than 4.0 mm, or e.g. less than 3.0 mm, or e.g. less than 2.0 mm). For example, a maximum (or largest) width of a (or each) fillet formable (or formed by) the fillet material from an edge of the semiconductor die on which it is formed may be less than 5.0 mm (or e.g. less than 4.0 mm, or e.g. less than 3.0 mm, or e.g. less than 2.0 mm). For example, a maximum width of the at least one fillet formable by the fillet at a middle portion of the edge of the semiconductor die may be less than 5.0 mm (or e.g. less than 4.0 mm, or e.g. less than 3.0 mm, or e.g. less than 2.0 mm). The middle portion of the edge of the semiconductor die may have a dimension of 30% (or 40%, or 50%, or less than 80%) of the total length (or size or dimension) of the edge of the semiconductor die, for example. The middle portion of the edge of the semiconductor die may be located equidistant (or half way) between corners regions of the semiconductor die formed by the edge of the semiconductor die.

Optionally, at least one fillet formable by the underfill material 607 may be located at at least one further edge of the semiconductor die. For example, a fillet formable by the underfill material 607 may be located at a dispensing edge of the semiconductor die the semiconductor die 201.

An angle between a slope at a middle of the fillet 605 formed by the fillet material and a surface of the carrier may be at least 10% (or e.g. at least 20% larger than, or e.g. at least 30% larger than) an angle between a slope at a middle of the fillet formed by the underfill material 607 and the surface of the carrier 202.

An angle between the slope at a middle of the fillet formed by the underfill material 607 and the surface (e.g. a first lateral side surface) of the carrier 202 may lie between 20° and 85° (or e.g. between 30° and 75°, or e.g. between 40° and 70°). The middle of the fillet formed by the underfill material 607 may be a point at the surface of the fillet in a cross-section of the fillet. The cross-section of the fillet formed by the underfill material may be at a middle of the at least one further edge of the semiconductor die 201. For example, the cross-section of the fillet formed by the underfill material may be a vertical cross-section substantially perpendicular to the further edge (e.g. the dispensing edge) of the semiconductor die. For example, the cross-section of the fillet may be located at the center (or at a midpoint) of the third edge of the semiconductor die. The point may be located at the surface of the fillet at 50% (or e.g. between 40% and 60%) of a height between a highest point of the fillet and a surface of the carrier 202. For example, the height between the highest point of the fillet and the surface of the carrier 202 may be a distance measured in a substantially vertical direction (e.g. substantially parallel to an edge of the semiconductor die) between the highest point of the fillet and the surface of the carrier 202.

A maximum (or average) width of the at least one fillet formable by (or formed by) the underfill material 607 from the at least one edge of the semiconductor die 201 may be at least 10% (or e.g. at least 20% larger than, or e.g. at least 30% larger than) a maximum (or average) width of the at least one fillet formable by (or formed by) the fillet material from the at least one edge of the semiconductor die.

A maximum (or average) width of the at least one fillet formable by (or formed by) the underfill material 607 from the at least one edge of the semiconductor die 201 may be less than 5.0 mm (or e.g. less than 4.0 mm, or e.g. less than 3.0 mm, or e.g. less than 2.0 mm). For example, a maximum (or largest) width of a (or each) fillet formable (or formed by) the underfill material 607 from an edge of the semiconductor die 201 on which it is formed may be less than 5.0 mm (or e.g. less than 4.0 mm, or e.g. less than 3.0 mm, or e.g. less than 2.0 mm). For example, a maximum width of the at least one fillet formable by the underfill at a middle portion of the edge of the semiconductor die 201 may be less than 5.0 mm (or e.g. less than 4.0 mm, or e.g. less than 3.0 mm, or e.g. less than 2.0 mm). The middle portion of the edge of the semiconductor die may have a dimension of 30% (or 40%, or 50%, or less than 80%) of the total length (or size or dimension) of the edge of the semiconductor die, for example. The middle portion of the edge of the semiconductor die may be located equidistant (or half way) between corners regions of the semiconductor die formed by the edge of the semiconductor die. For example, the middle portion of the dispensing edge of the semiconductor die may be located equidistant (or half way) between the first edge of the semiconductor die and the second edge of the semiconductor die.

An average width of a keep out zone at an edge of the semiconductor die at which the at least one fillet formed by the thixotropic fillet material is formed may be smaller than an average width of a keep out zone at an edge of the semiconductor die at which at least one fillet formed by the underfill material is formed.

A keep out zone may be a part of the carrier 202 or a part of the electrical device without any semiconductor dies, and/or without any electrically conductive structures, and/or without any electrical components, for example.

In the examples, fillets formable (fully or at least partially) by the fillet material may be located at at least two edges (e.g. two edges, or three edges or four edges) of the semiconductor die. Optionally, fillets formable (fully or at least partially) by the underfill material may be located at at least one edge (e.g. one edge, or e.g. two edges) of the semiconductor die.

More details and aspects are mentioned in connection with the examples described above or below. The examples shown in FIGS. 1 to 6 may comprise one or more optional additional features corresponding to one or more aspects mentioned in connection with the proposed concept or one or more examples described above (e.g. FIGS. 1 to 5B) or below (FIG. 7).

Figure 7A:
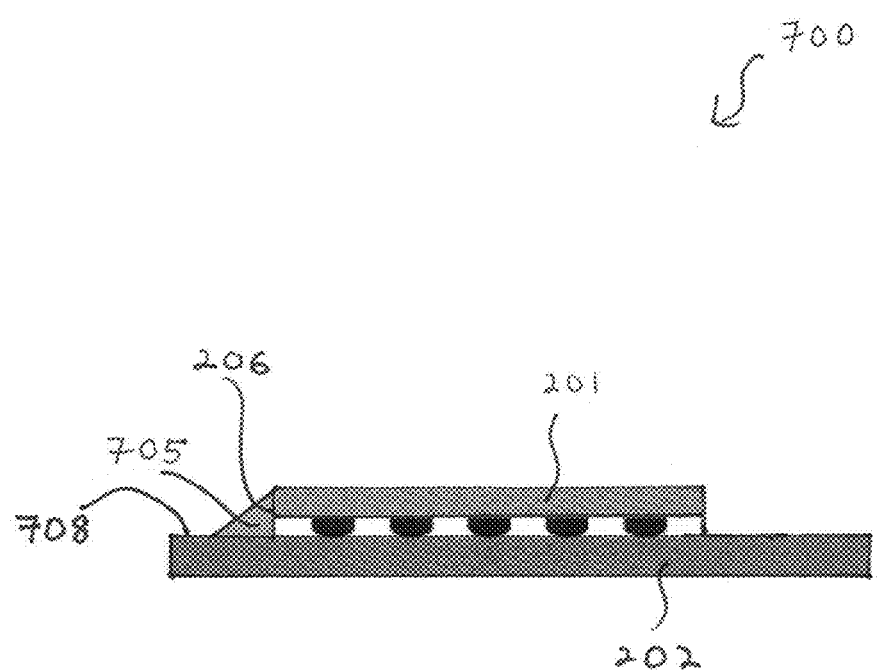
FIG. 7A shows a schematic illustration of a further electrical device.

FIG. 7A shows a schematic illustration of an electrical device 700 according to an example.

The electrical device 700 comprises a semiconductor die 201 arranged on a carrier 202. The electrical device 700 further comprises a fillet 705 located at at least one edge 206 of the semiconductor die 201. An angle between a slope at a middle of the fillet 705 and a surface 708 of the carrier lies between 20° and 85° (or e.g. between 30° and 75°, or e.g. between 40° and 70°).

Due to the electrical device comprising a fillet having an angle between a slope at a middle of the fillet 705 and a surface 708 of the carrier lies between 20° and 85°, underfill material volumes may be reduced and sizes of keep out zones of the electrical device may be reduced. Thus, the size of the electrical device may be reduced, for example, The first fillet 705 is formable by a thixotropic fillet material. The thixotropic fillet material may be similar or identical to the fillet material described in connection with FIGS. 1A to 5B.

The (first) fillet 705 may include one or more or all of the features of the fillet formable by the thixotropic material described in connection with FIGS. 1 to 6. For example, an angle between a slope at a middle of the (first) fillet 705 and a surface 708 (e.g. a first lateral side surface) of the carrier 202 may lie between 20° and 85° (or e.g. between 30° and 75°, or e.g. between 40° and 70°). For example, a maximum (or average) width of the first fillet 705 formable by (or formed by) the fillet material from the edge 206 of the semiconductor die 201 may be less than 5.0 mm (or e.g. less than 4.0 mm, or e.g. less than 3.0 mm, or e.g. less than 2.0 mm).

The electrical device 700 may further include a second fillet formable by an underfill material located at at least one further edge of the semiconductor die. The underfill material for the second fillet may be identical to an underfill material located in the gap between the semiconductor die 201 and the carrier 202, for example. The underfill material may be similar or identical to the underfill material described in connection with FIGS. 1A to 6.

Figure 7B:
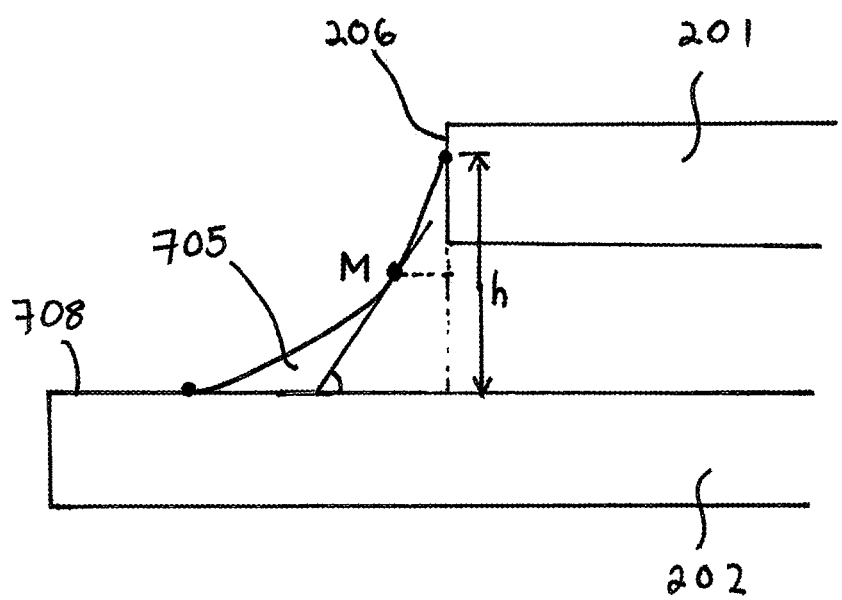
FIG. 7B shows a schematic illustration of an angle between a slope at a middle of a fillet and a surface of the carrier.

As shown in FIG. 7B, the middle of the fillet may be a point, M, at the surface of the fillet in a cross-section of the fillet. The (middle) point M may be located at the surface of the fillet at 50% (or e.g. between 40% and 60%) of a height, h, between a highest point of the fillet and a surface of the carrier.

The (second) fillet may include one or more or all of the features of the fillet formable by the underfill material described in connection with FIGS. 1 to 6. For example, an angle between a slope at a middle of the second fillet and the surface 708 of the carrier 202 lies between 20° and 85°. For example, a maximum (or average) width of the second filet from the further edge of the semiconductor die 201 may be less than 5.0 mm (or e.g. less than 4.0 mm, or e.g. less than 3.0 mm, or e.g. less than 2.0 mm).

A maximum (or average) width of the second fillet from the further edge of the semiconductor die 201 may be at least 10% (or e.g. at least 20% larger than, or e.g. at least 30% larger than) a maximum (or average) width of the first fillet from the edge of the semiconductor die.

An angle between a slope at a middle of the first fillet and a surface of the carrier 202 may be at least 10% (or e.g. at least 20% larger than, or e.g. at least 30% larger than) an angle between a slope at a middle of the second and the surface of the carrier 202.

An average width of a keep out zone at the edge of the semiconductor die 201 at which the first fillet 705 is formed may be smaller than an average width of a keep out zone at the further edge of the semiconductor die 201 at which the second fillet is formed.

More details and aspects are mentioned in connection with the examples described above or below. The examples shown in FIGS. 1 to 7 may comprise one or more optional additional features corresponding to one or more aspects mentioned in connection with the proposed concept or one or more examples described above (e.g. FIGS. 1 to 6) or below Various examples relate to a two-material multi-part dispense process to reduce underfill keep-out zones on flip chip packages. The various examples may relate to dispenses, flip-chip packages, keep-out zones, underfill processes, flip-chip land/ball/pin grid arrays (FC-XGA) packages. The various examples may relate to high volume architecture, or examples embodied in computer system architecture features and interfaces made in high volumes. The various examples may relate to IA, devices (e.g., transistors) and associated manufacturing processes. The various examples may be used as a packaging and/or assembly for central processing units (CPUs) and/or processors, chipsets, graphics devices, wireless devices, multi-chip or 3D package including a CPU in combination with other devices, memory (e.g. FLASH/DRAM/SRAM), and/or boards (e.g. motherboards).

The various examples may have a unique combination of components/techniques, which may reduce the complexities compared to other structures and techniques. The use of two different materials for under-filling and filleting adds another interface on the package (between the two materials), for example. Techniques may be used to mitigate risks, such as by the characterization of the interface in terms of its ability to withstand different thermomechanical and hygroscopic stresses to reduce delamination initiation or the effects of a propagation region.

The various examples may enable a reduction in package sizes, a reduction in package layer count (by avoiding solder resist openings for keep-out zone KOZ reduction), and/or a reduction in process costs (by avoiding to have a barrier material), for example.

Aspects and features (e.g. the semiconductor die, the carrier, the at least one solder structure, the gap between the semiconductor die and the carrier, the fillet formable by the thixotropic material, the fillet formable by the underfill material, the first fillet, the second fillet, the first edge, the second edge, the dispensing edge, the third edge and the fillet structure) mentioned in connection with one or more specific examples may be combined with one or more of the other examples.

There is a demand for electrical devices and/or methods for forming electrical devices with reduced complexity, low cost, and reduced throughput. This demand may be satisfied by the subject matter of the examples.

In the following examples pertain to further examples. Example 1 is a method for forming an electrical device, the method comprising attaching a semiconductor die on a carrier;

dispensing a fillet material at at least one edge of the semiconductor die arranged on the carrier; and dispensing an underfill material into a gap between the semiconductor die and the carrier after dispensing the fillet material.

In example 2, the subject matter of example 1 can optionally include the fillet material comprising a thixotropic material.

In example 3, the subject matter of example 1 or 2 can optionally include the thixotropic index of the fillet material being greater than 1.0.

In example 4, the subject matter of any of examples 1 to 3 can optionally include the fillet material comprising filler particles, wherein the filler particles are selected from at least one of the group comprising silica particles, graphite particles, silver particles, nickel particles, alumina particles, and boron nitride particles.

In example 5, the subject matter of example 4 can optionally include the filler particles being embedded in a matrix material, wherein the matrix material is selected from at least one of the group comprising polyepoxies, polyacrylates, polyamide, polyanhydrides, polyamines, phenolics.

In example 6, the subject matter of example 4 or 5 can optionally include at least 10% of the fillet material being filler particles.

In example 7, the subject matter of any of examples 1 to 6 can optionally include the fillet material being different from the underfill material.

In example 8, the subject matter of any of examples 1 to 7 can optionally include the underfill material being selected from at least one of the group comprising polyepoxies, polyacrylates, polyamide, polyanhydrides, polyamines, phenolics.

In example 9, the subject matter of any of examples 1 to 8 can optionally include curing the fillet material to form a fillet at the at least one edge of the semiconductor die before dispensing the underfill material.

In example 10, the subject matter of any of examples 1 to 9 can optionally include curing the fillet material and the underfill material in the same curing process after dispensing the underfill material.

In example 11, the subject matter of any of examples 1 to 10 can optionally include the fillet material being dispensed at a first edge of the semiconductor die and at an opposite second edge of the semiconductor die.

In example 12, the subject matter of example 11 can optionally include the underfill material being dispensed into the gap between the semiconductor die and the carrier from a dispensing edge of the semiconductor die, wherein the dispensing edge of the semiconductor die is orthogonal to the first edge of the semiconductor die and the second edge of the semiconductor die.

In example 13, the subject matter of example 12 can optionally include the underfill material being dispensed from the dispensing edge of the semiconductor die towards an opposite third edge of the semiconductor die through the gap between the semiconductor die and the carrier.

In example 14, the subject matter of any of examples 1 to 13 can optionally include the fillet material being dispensed to form a fillet structure comprising the fillet material between the first semiconductor die and a neighboring second semiconductor die arranged on the carrier, wherein a first portion of the fillet structure is dispensed at an edge of the first semiconductor die and wherein a second portion of the fillet structure is dispensed at an edge of the second semiconductor die.

In example 15, the subject matter of example 14 can optionally include an average distance between neighboring edges of the first semiconductor die and the second semiconductor die greater than 0.1 mm.

In example 16, the subject matter of example 12 can optionally include fillet material being dispensed at the dispensing edge of the semiconductor die after dispensing the underfill material.

In example 17, the subject matter of example 12 can optionally include fillet material being dispensed at a third edge of the semiconductor die located opposite to the dispensing edge of the semiconductor die after dispensing the underfill material.

In example 18, the subject matter of any of examples 1 to 17 can optionally include the carrier being a printed circuit board, a flip-chip substrate or a lead frame.

In example 19, the subject matter of any of examples 1 to 18 can optionally include the attaching of the semiconductor die on the carrier comprising soldering the semiconductor die to the carrier so that at least one solder structure is located in the gap between the semiconductor die and the carrier.

In example 20, the subject matter of any of examples 1 to 19 can optionally include the fillet material being dispensed from a jetting dispenser, from a piston dispenser, from an auger dispenser, or from a pressure-time dispenser.

Example 21 is an electrical device, comprising a semiconductor die arranged on a carrier; at least one fillet located at at least one edge of the semiconductor die, wherein the at least one fillet is formable by a thixotropic fillet material; and an underfill material located in a gap between the semiconductor die and the carrier.

In example 22, the subject matter of example 21 can optionally include the thixotropic fillet material being different from the underfill material.

In example 23, the subject matter of example 21 or 22 can optionally include the fillet comprising filler particles, wherein the filler particles are selected from at least one of the group comprising silica particles, graphite particles, silver particles, nickel particles, alumina particles, and boron nitride particles.

In example 24, the subject matter of any of examples 21 to 23 can optionally include at least 10% of the fillet material being filler particles.

In example 25, the subject matter of any of examples 21 to 24 can optionally include a first fillet formable by the thixotropic fillet material being located at a first edge of the semiconductor die and a second fillet formable by the thixotropic fillet material being located at an opposite second edge of the semiconductor die.

In example 26, the subject matter of any of examples 21 to 25 can optionally include a fillet structure formable by the thixotropic fillet material located between the first semiconductor die and a neighboring second semiconductor die, wherein a first portion of the fillet structure forms a fillet located at an edge of the first semiconductor die, and wherein a second portion of the fillet structure forms a fillet located at an edge of the second semiconductor die.

In example 27, the subject matter of example 26 can optionally include an average distance between the first semiconductor die and the second semiconductor die greater than 0.1 mm.

In example 28, the subject matter of any of examples 21 to 27 can optionally include the carrier being a printed circuit board, a flip-chip substrate or a lead frame.

In example 29, the subject matter of any of examples 21 to 28 can optionally include the semiconductor die being connected to the carrier via at least one solder structure located in the gap between the semiconductor die and the carrier.

In example 30, the subject matter of any of examples 21 to 29 can optionally include a angle between a slope at a middle of the fillet and a surface of the carrier lying between 20° and 85°.

In example 31, the subject matter of example 30 can optionally include the middle of the fillet being a point at the surface of the fillet in a cross-section of the fillet, wherein the point is located at the surface of the fillet at 50% of a height between a highest point of the fillet and a surface of the carrier, wherein the cross-section of the fillet is at a middle of the at least one edge of the semiconductor die.

In example 32, the subject matter of any of examples 21 to 31 can optionally include a maximum width of the at least one fillet from the at least one further edge of the semiconductor die being less than 5.0 mm.

In example 33, the subject matter of any of examples 21 to 32 can optionally include at least one fillet formable by the underfill material located at at least one edge of the semiconductor die.

In example 34, the subject matter of example 33 can optionally include an average width of a keep out zone at an edge of the semiconductor die at which the at least one fillet formed by the thixotropic fillet material is formed being smaller than an average width of a keep out zone at an edge of the semiconductor die at which at least one fillet formed by the underfill material is formed.

Example 35 is an electrical device, comprising a semiconductor die arranged on a carrier; and a fillet located at at least one edge of the semiconductor die, wherein an angle between a slope at a middle of the fillet and a surface of the carrier lies between 20° and 85°.

In example 36, the subject matter of example 35 can optionally include the middle of the fillet being a point at the surface of the fillet in a cross-section of the fillet, wherein the point is located at the surface of the fillet at 50% of a height between a highest point of the fillet and a surface of the carrier, wherein the cross-section of the fillet is at a middle of the at least one edge of the semiconductor die.

In example 37, the subject matter of example 35 or 36 can optionally include a maximum width of the fillet from the edge of the semiconductor die being less than 5.0 mm.

In example 38, the subject matter of any of examples 35 to 57 can optionally include the fillet being formable by a thixotropic fillet material.

In example 39, the subject matter of any of examples 36 to 38 can optionally include a second fillet formable by an underfill material located at at least one further edge of the semiconductor die, wherein an angle between a slope at a middle of the fillet and a surface of the carrier lies between 20° and 85°.

In example 40, the subject matter of example 39 can optionally include a maximum width of the second fillet from the further edge of the semiconductor die being less than 5.0 mm.

In example 41, the subject matter of example 39 or 40 can optionally include the underfill material for forming the second fillet being identical to an underfill material located in a gap between the semiconductor die and the carrier.

In example 42, the subject matter of any of examples 39 to 41 can optionally include an average width of a keep out zone at an edge of the semiconductor die at which the first fillet is formed being smaller than an average width of a keep out zone at an edge of the semiconductor die at which the second fillet is formed.

Example 43 is a computer readable storage medium having stored thereon a program having a program code for performing the method of any of examples 1 to 20, when the program is executed on a computer or processor.

Examples may further provide a computer program having a program code for performing one of the above methods, when the computer program is executed on a computer or processor. A person of skill in the art would readily recognize that acts of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons.

Furthermore, in some examples a single act may include or may be broken into multiple sub acts. Such sub acts may be included and part of the disclosure of this single act unless explicitly excluded.

What is claimed is:

1. A method for forming an electrical device, the method comprising:
    attaching a semiconductor die on a carrier;
    dispensing a fillet material at at least one edge of the semiconductor die arranged on the carrier; and
    dispensing an underfill material into a gap between the semiconductor die and the carrier after dispensing the fillet material.

2. The method according to claim 1, wherein the fillet material comprises a thixotropic material.

3. The method according to claim 1, wherein a thixotropic index of the fillet material is greater than 1.0.

4. The method according to claim 1, wherein the fillet material comprises filler particles, wherein the filler particles are selected from at least one of the group comprising silica particles, graphite particles, silver particles, nickel particles, alumina particles, and boron nitride particles.

5. The method according to claim 4, wherein the filler particles are embedded in a matrix material, wherein the matrix material is selected from at least one of the group comprising polyepoxies, polyacrylates, polyamide, polyanhydrides, polyamines, and phenolics.

6. The method according to claim 4, wherein at least 10% of the fillet material are filler particles.

7. The method according to claim 1, wherein the fillet material is different from the underfill material.

8. The method according to claim 1, wherein the underfill material is selected from at least one of the group comprising polyepoxies, polyacrylates, polyamide, polyanhydrides, polyamines, and phenolics.

9. The method according to claim 1, further comprising curing the fillet material to form a fillet at the at least one edge of the semiconductor die before dispensing the underfill material.

10. The method according to claim 1, further comprising curing the fillet material and the underfill material in the same curing process after dispensing the underfill material.

11. The method according to claim 1, wherein the fillet material is dispensed at a first edge of the semiconductor die and at an opposite second edge of the semiconductor die.

12. The method according to claim 11, wherein the underfill material is dispensed into the gap between the semiconductor die and the carrier from a dispensing edge of the semiconductor die, wherein the dispensing edge of the semiconductor die is orthogonal to the first edge of the semiconductor die and the second edge of the semiconductor die.

13. The method according to claim 12, wherein the underfill material is dispensed from the dispensing edge of the semiconductor die towards an opposite third edge of the semiconductor die through the gap between the semiconductor die and the carrier.

14. The method according to claim 1, wherein the fillet material is dispensed to form a fillet structure comprising the fillet material between the first semiconductor die and a neighboring second semiconductor die arranged on the carrier, wherein a first portion of the fillet structure is dispensed at an edge of the first semiconductor die and wherein a second portion of the fillet structure is dispensed at an edge of the second semiconductor die.

15. The method according to claim 14, wherein an average distance between neighboring edges of the first semiconductor die and the second semiconductor die is greater than 0.1 mm.

\* \* \* \* \*